(12) United States Patent
Wang et al.

(10) Patent No.: US 11,674,909 B2
(45) Date of Patent: Jun. 13, 2023

(54) SYSTEMS AND METHODS FOR SEMICONDUCTOR CHIP HOLE GEOMETRY METROLOGY

(71) Applicant: YANGTZE MEMORY TECHNOLOGIES CO., LTD., Wuhan (CN)

(72) Inventors: Le Wang, Wuhan (CN); Yuanxiang Zou, Wuhan (CN); Jun Zhang, Wuhan (CN); Wei Zhang, Wuhan (CN); Yi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 91 days.

(21) Appl. No.: 17/334,394

(22) Filed: May 28, 2021

(65) Prior Publication Data

US 2021/0293727 A1    Sep. 23, 2021

Related U.S. Application Data

(63) Continuation of application No. 16/863,168, filed on Apr. 30, 2020, now Pat. No. 11,041,814, which is a
(Continued)

(51) Int. Cl.
*G01N 21/95* (2006.01)
*G01N 21/21* (2006.01)
(Continued)

(52) U.S. Cl.
CPC ......... *G01N 21/9501* (2013.01); *G01B 11/24* (2013.01); *G01N 21/211* (2013.01);
(Continued)

(58) Field of Classification Search
CPC ............ G01N 21/9501; G01N 21/211; G01N 21/956; G01N 2021/213;
(Continued)

(56) References Cited

U.S. PATENT DOCUMENTS

| 6,236,033 B1 | 5/2001 | Ebbesen et al. |
| 6,389,408 B1 | 5/2002 | Carrieri |

(Continued)

FOREIGN PATENT DOCUMENTS

| CN | 101393015 A | 3/2009 |
| CN | 102750333 A | 10/2012 |

(Continued)

OTHER PUBLICATIONS

International Search Report issued in corresponding International Application No. PCT/CN2020/079223, dated Dec. 15, 2020, 5 pages.

*Primary Examiner* — Roy M Punnoose
(74) *Attorney, Agent, or Firm* — Bayes PLLC

(57) ABSTRACT

In certain aspects, a method for training a model is disclosed. A model for measuring a geometric attribute of a hole structure in a semiconductor chip is provided by at least one processor. A plurality of training samples each including a pair of an optical spectrum signal and a reference signal corresponding to a same hole structure are obtained by the at least one processor. The reference signal is labeled with a labeled geometric attribute of the hole structure. An estimated geometric attribute of the hole structure is estimated using the model. A parameter of the model is adjusted based, at least in part, on a difference between the labeled geometric attribute and the estimated geometric attribute in each of the training samples by the at least one processor.

20 Claims, 11 Drawing Sheets

Related U.S. Application Data continuation of application No. PCT/CN2020/079223, filed on Mar. 13, 2020.

(51) Int. Cl.

| | |
|---|---|
| *G06N 3/08* | (2023.01) |
| *G01B 11/24* | (2006.01) |
| *G01N 21/956* | (2006.01) |
| *H01L 23/538* | (2006.01) |
| *H01L 27/11556* | (2017.01) |
| *H01L 27/11582* | (2017.01) |

(52) U.S. Cl.
CPC ............ *G01N 21/956* (2013.01); *G06N 3/08* (2013.01); *H01L 23/5384* (2013.01); *H01L 27/11556* (2013.01); *H01L 27/11582* (2013.01); *G01N 2021/213* (2013.01); *G01N 2021/95653* (2013.01)

(58) Field of Classification Search
CPC .......... G01N 2021/95653; G01B 11/24; G01B 11/00; G06N 3/08; H01L 23/5384; H01L 27/11556; H01L 27/11582; H01L 22/20; H01L 22/12; G03F 7/70633

See application file for complete search history.

(56) References Cited

U.S. PATENT DOCUMENTS

| | | | |
|---|---|---|---|
| 7,302,367 | B2 | 11/2007 | Li et al. |
| 9,121,696 | B2 | 9/2015 | Jin et al. |
| 11,041,814 | B1* | 6/2021 | Wang ................. H01L 23/5384 |
| 2011/0017715 | A1 | 1/2011 | Marcus et al. |
| 2013/0206992 | A1 | 8/2013 | Jin et al. |
| 2019/0318261 | A1* | 10/2019 | Deng ................... G06K 9/6256 |
| 2020/0201952 | A1 | 6/2020 | Kim et al. |

FOREIGN PATENT DOCUMENTS

| | | |
|---|---|---|
| CN | 107576630 A | 1/2018 |
| CN | 109612943 A | 4/2019 |
| JP | H0886628 A | 4/1996 |
| JP | 2016148747 A | 8/2016 |
| TW | 201209371 A | 3/2012 |
| TW | 201921174 A | 6/2019 |
| TW | 201930858 A | 8/2019 |
| TW | 201945691 A | 12/2019 |
| TW | 201945967 A | 12/2019 |
| TW | 202002119 A | 1/2020 |
| TW | 202007958 A | 2/2020 |

* cited by examiner

402

900

SYSTEMS AND METHODS FOR SEMICONDUCTOR CHIP HOLE GEOMETRY METROLOGY

CROSS-REFERENCE TO RELATED APPLICATIONS

This application is a continuation of U.S. application Ser. No. 16/863,168, filed on Apr. 30, 2020, entitled "SYSTEMS AND METHODS FOR SEMICONDUCTOR CHIP HOLE GEOMETRY METROLOGY," which is continuation of International Application No. PCT/CN2020/079223, filed on Mar. 13, 2020, entitled "SYSTEMS AND METHODS FOR SEMICONDUCTOR CHIP HOLE GEOMETRY METROLOGY," both of which are incorporated herein by reference in their entireties.

BACKGROUND

Embodiments of the present disclosure relate to metrology systems and methods in semiconductor manufacturing.

Hole structures are widely used in semiconductor chip fabrication, such as contact holes and channel holes in three-dimensional (3D) memory devices. Hole structures, especially deep holes with high aspect ratios, are usually made by plasma dry etching, such as deep reactive-ion etching (DRIE). As the aspect ratio continues increasing, the fabrication of deep holes suffers from various issues and challenges, such as vertical and sloped sidewalls, loading effect, lag, scalloping, and notching effect, most of which are reflected as undesired geometric attributes of the holes. Therefore, inline measurement of hole structures in semiconductor chip fabrication becomes important for product yield.

SUMMARY

Embodiments of systems and methods for measuring a geometric attribute of a hole structure in a semiconductor chip are disclosed herein.

In one example, a method for measuring a geometric attribute of a hole structure in a semiconductor chip is disclosed. An optical spectrum signal corresponding to the hole structure in the semiconductor chip is received. The optical spectrum signal is characterized by one or more optical features. The geometric attribute of the hole structure is determined based, at least in part, on the optical features using a model. The model is trained from a plurality of training samples each including a pair of an optical spectrum signal and a labeled reference signal both corresponding to a same hole structure.

In another example, a system for measuring a geometric attribute of a hole structure in a semiconductor chip includes an optical spectrometer and at least one processor. The optical spectrometer is configured to provide an optical spectrum signal corresponding to the hole structure in the semiconductor chip. The at least one processor is configured to characterize the optical spectrum signal by one or more optical features. The at least one processor is also configured to determine the geometric attribute of the hole structure based, at least in part, on the optical features using a model. The model is trained from a plurality of training samples each including a pair of an optical spectrum signal and a labeled reference signal both corresponding to a same hole structure.

In still another example, a tangible computer-readable device has instructions stored thereon that, when executed by at least one computing device, causes the at least one computing device to perform operations. The operations include receiving an optical spectrum signal corresponding to a hole structure in a semiconductor chip. The operations also include characterizing the optical spectrum signal by one or more optical features. The operations further include determining the geometric attribute of the hole structure based, at least in part, on the optical features using a model. The model is trained from a plurality of training samples each including a pair of an optical spectrum signal and a labeled reference signal both corresponding to a same hole structure.

In yet another example, a method for training a model is disclosed. A model for measuring a geometric attribute of a hole structure in a semiconductor chip is provided by at least one processor. A plurality of training samples each including a pair of an optical spectrum signal and a reference signal corresponding to a same hole structure are obtained by the at least one processor. The reference signal is labeled with a labeled geometric attribute of the hole structure. An estimated geometric attribute of the hole structure is estimated using the model. A parameter of the model is adjusted based, at least in part, on a difference between the labeled geometric attribute and the estimated geometric attribute in each of the training samples by the at least one processor.

In yet another example, a system for training a model includes a memory and at least one processor operatively coupled to the memory. The at least one processor is configured to provide a model for measuring a geometric attribute of a hole structure in a semiconductor chip. The at least one processor is also configured to obtain a plurality of training samples each including a pair of an optical spectrum signal and a reference signal corresponding to a same hole structure. The reference signal is labeled with a labeled geometric attribute of the hole structure. The at least one processor is further configured to estimate an estimated geometric attribute of the hole structure using the model. The at least one processor is further configured to adjust a parameter of the model based, at least in part, on a difference between the labeled geometric attribute and the estimated geometric attribute in each of the training samples.

In yet another example, a tangible computer-readable device has instructions stored thereon that, when executed by at least one computing device, causes the at least one computing device to perform operations. The operations include providing a model for measuring a geometric attribute of a hole structure in a semiconductor chip. The operations also include obtaining a plurality of training samples each including a pair of an optical spectrum signal and a reference signal corresponding to a same hole structure. The reference signal is labeled with a labeled geometric attribute of the hole structure. The operations further include estimating an estimated geometric attribute of the hole structure using the model. The operations further include adjusting a parameter of the model based, at least in part, on a difference between the labeled geometric attribute and the estimated geometric attribute in each of the training samples.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1C:
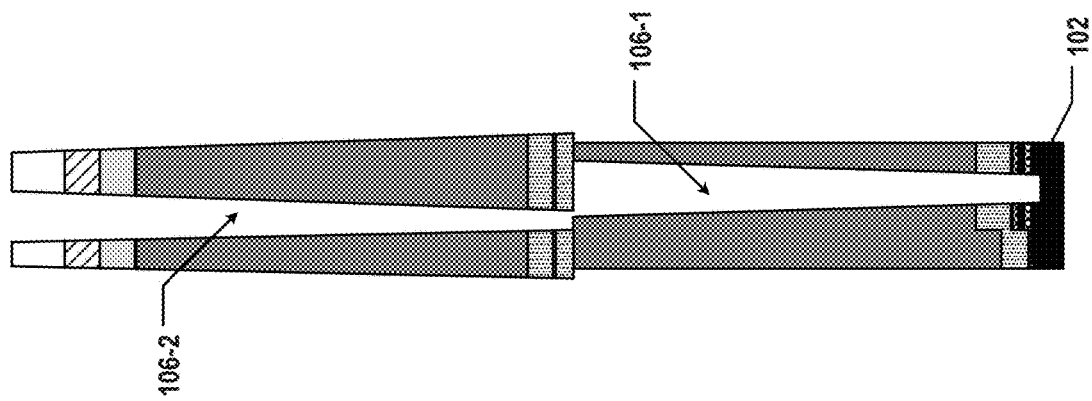
FIG. 1C illustrates a cross-section of an upper channel hole and lower channel hole in the channel hole structure in FIG. 1A with an overlay.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Figure 1B:
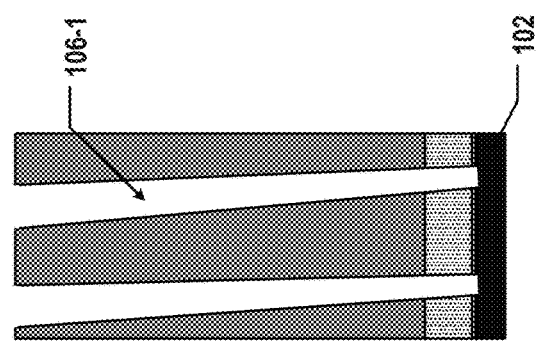
FIG. 1B illustrates a cross-section of a lower channel hole in the channel hole structure in FIG. 1A with tilt.
Figure 1A:
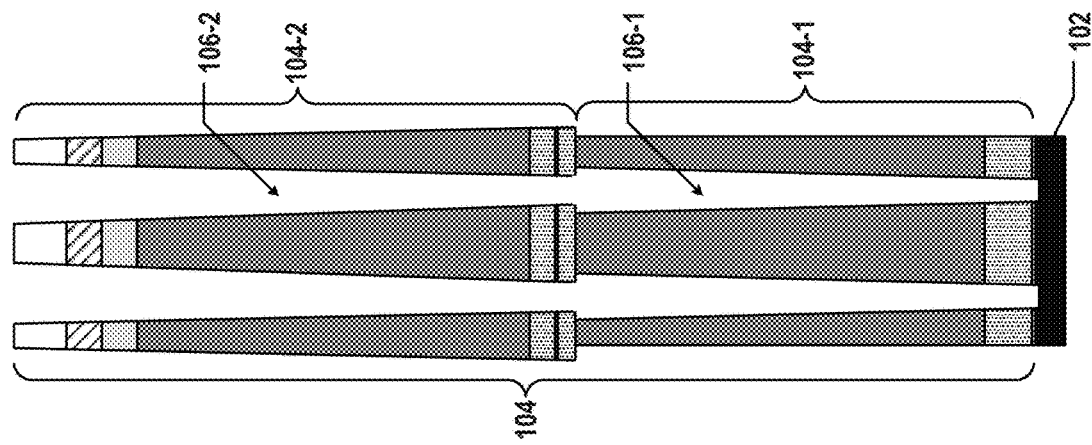
FIG. 1A illustrates a cross-section of a channel hole structure in a semiconductor chip.

In semiconductor chip fabrication, such as forming 3D NAND memory devices, hole structures are commonly used. For example, FIG. 1A illustrates a cross-section of a channel hole structure in a semiconductor chip. The semiconductor chip includes an intermediate structure, as shown in FIG. 1A, in forming a 3D NAND memory device. The intermediate structure includes a substrate 102 and an alternating layer stack 104 having a lower alternating layer stack 104-1 and an upper alternating layer stack 104-2 above lower alternating layer stack 104-1. A plurality of channel hole structures each including a lower channel hole 106-1 and an upper channel hole 106-2 above lower channel hole 106-1 are formed extending through alternating layer stack 104, for example, using DRIE. Specifically, lower channel hole 106-1 extends through lower alternating layer stack 104-1, and upper channel hole 106-2 extends through upper alternating layer stack 104-2. An array of channel structures of the 3D NAND memory device are to be formed in the channel hole structures in FIG. 1A, respectively, in the final semiconductor chip after the fabrication process is completed.

As the number of layers in alternating layer stack 104 continues increasing in order to increase the memory cell density, the DRIE process for forming the channel hole structures becomes more challenging, causing various issues, such as tilting and misalignment between upper and lower channel holes 106-2 and 106-1. In one example, FIG. 1B illustrates a cross-section of lower channel hole 106-1 in the channel hole structure in FIG. 1A with tilt. That is, lower channel hole 106-1 is not straight, but rather has an inclination or a slope (i.e., the tilt) along the vertical direction. In another example, FIG. 1C illustrates a cross-section of upper channel hole 106-2 and lower channel hole 160-1 in the channel hole structure in FIG. 1A with an overlay. That is, the center of gravity at the top of upper channel hole 106-2 and the center of gravity at the top of lower channel hole 106-1 are not aligned in the lateral direction, but rather are mismatched by the overlay.

Figure 2A:
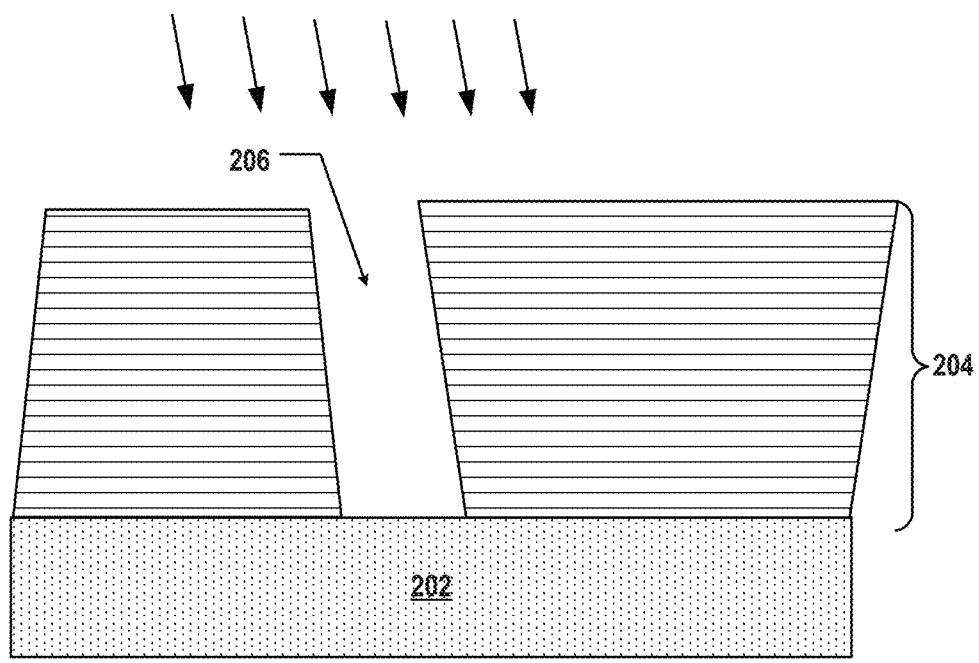
FIGS. 2A and 2B illustrate measurement of the tilt of a hole structure in a semiconductor chip using a scanning electron microscope (SEM).
Figure 2B:
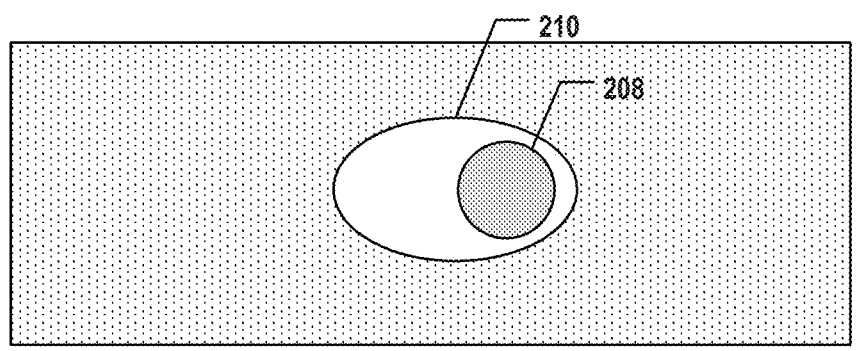
Figure 3:
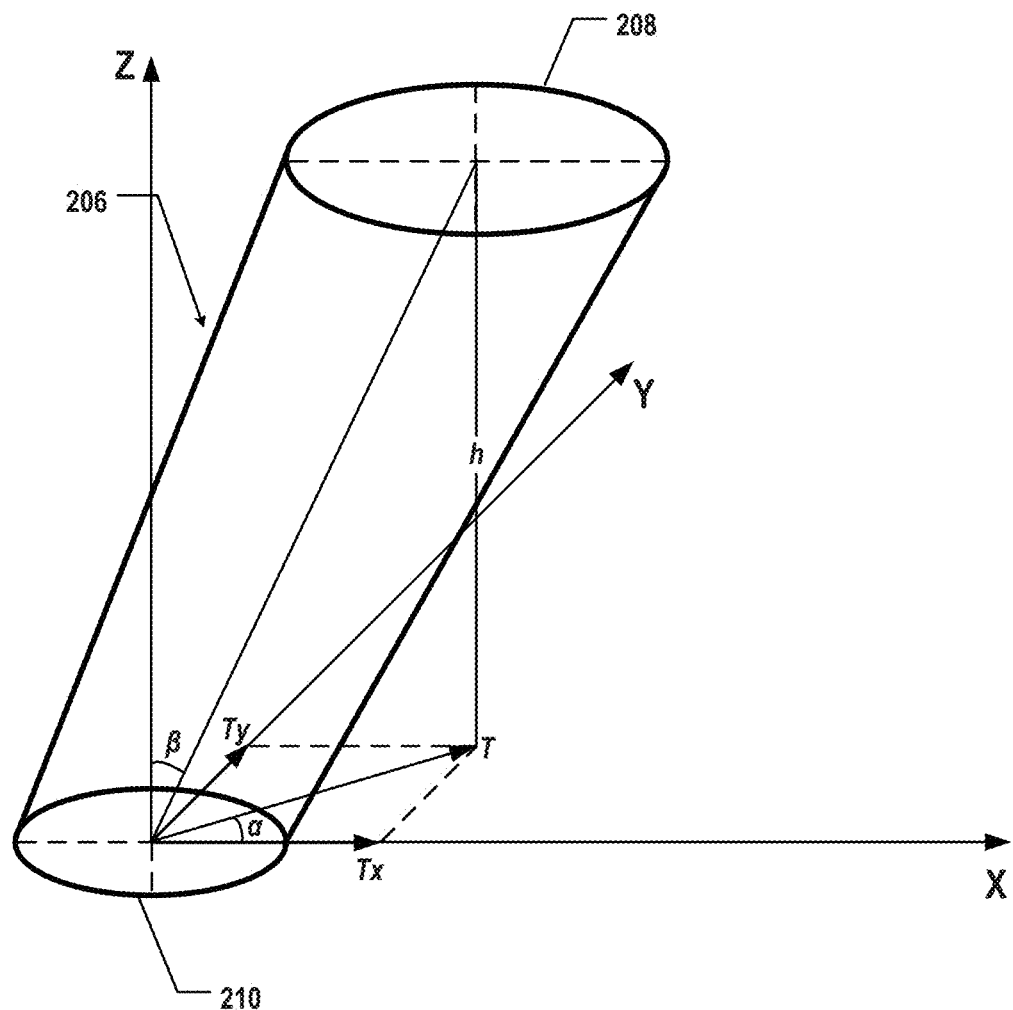
FIG. 3 illustrates the tilt vector and its components in the x-axis and y-axis of the hole structure in FIG. 2A.

High voltage (HV)-SEMs with tilted electron beams are commonly used for inline monitor of the tilt of a hole structure during the fabrication process of a semiconductor chip. For example, FIGS. 2A and 2B illustrate measurement of the tilt of a hole structure in a semiconductor chip using an SEM. As shown in FIG. 2A, a hole structure 206 extends through an alternating layer stack 204 above a substrate 202 in the semiconductor chip. The tilt angle of the electron beam emitting from an HV-SEM needs to be carefully adjusted to match the tilt angle of hole structure 206 in order to obtain the full profiles of top surface 208 and bottom surface 210 of hole structure 206, as shown in FIGS. 2A and 2B. FIG. 3 illustrates the tilt vector and its components in the x-axis and y-axis of hole structure 206 in FIG. 2A. The profiles of top surface 208 and bottom surface 210 of hole structure 206 are mapped into the x-y-z coordinate system in FIG. 3, with the center of gravity at bottom surface 210 being the origin. The tilt vector T of hole structure 206 is projected onto the x-y plane. The component of T in the x-axis Tx is calculated as h×Tan β×Cos α, and the component of T in the y-axis Ty is calculated as h×Tan β×Sin α, where h is the depth of hole structure 206 (i.e., the component of T in the z-axis), a is the angle between T and the x-axis, and β is the angle between T and the z-axis.

The known measurement approach using HV-SEMs, however, is time consuming due to the need of adjusting the tilt angle of the electron beam, as well as the large volume of data that needs to be processed, thereby limiting its throughput in inline monitoring of geometric attributes (e.g., tilt or overlay) of hole structures. Moreover, the continuous running of HV-SEMs for inline measurement may increase the maintenance cost and shorten the lifetime of the equipment. In some cases, for example, when measuring the overlap between upper and lower holes, damages may be made to the semiconductor chips, for example, by removing part of the hole structures.

Various embodiments in accordance with the present disclosure provide efficient systems and methods for inline hole geometry metrology with high throughput suitable for semiconductor chip mass production, while still maintaining sufficient accuracy and precision. In some embodiments, optical spectrum signals, such as spectroscopic ellipsometry signals, combined with machine learning models, can enable high throughput, non-destructive, inline measurement of hole structure geometric attributes (e.g., tilt or overlay) in semiconductor chips. Compared with HV-SEMs, optical spectrum measurement instruments can provide higher throughput in measuring hole structures, in particular the hole structure with tilt and the hole structure having an overlay between upper and lower holes. The machine learning models, well trained offline from training samples labeled using electron microscopy (e.g., SEMs), can be used to more quickly determine the target geometric attributes based on the optical spectrum signal input, without sacrificing the accuracy and precision, compared with the conventional approach that needs to process a large volume of data obtained by HV-SEMs from continuous inline measurement.

Figure 4:
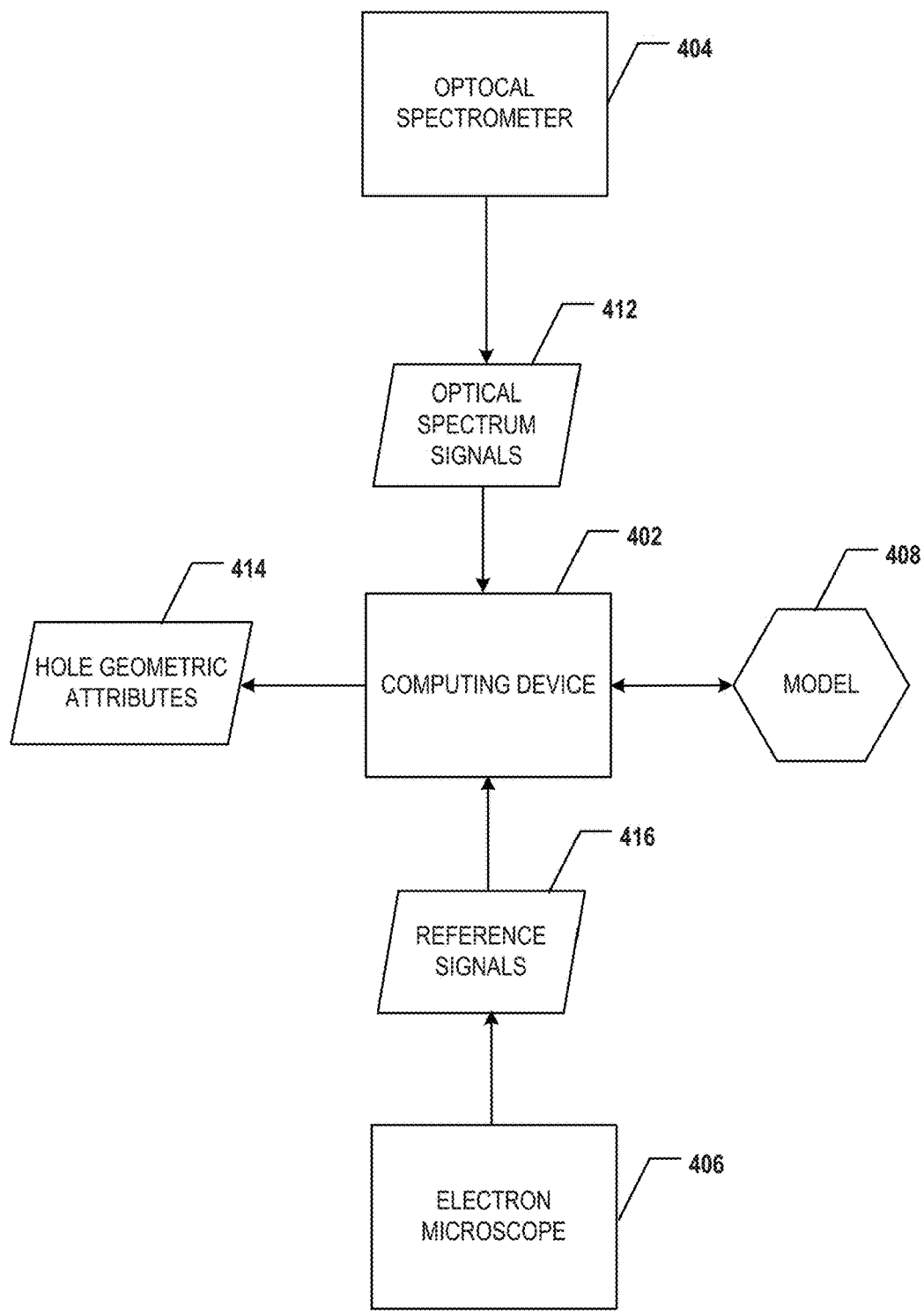
FIG. 4 illustrates a schematic diagram of an exemplary system for measuring a geometric attribute of a hole structure in a semiconductor chip, according to some embodiments of the present disclosure.

FIG. 4 illustrates a schematic diagram of an exemplary system 400 for measuring a geometric attribute of a hole structure in a semiconductor chip, according to some embodiments of the present disclosure. System 400 can include a computing device 402 having at least one processor that implements the various functions disclosed herein for measuring hole geometric attributes 414 of a semiconductor chip, such as signal characterization, hole geometry measurement using machine learning models, and model training. The semiconductor chip can include a logic device chip, such as a central processing unit (CPU), a graphics processing unit (GPU), an application processor (AP), a programmable logic device (PLD), or a microcontroller unit (MCU), a memory device chip, such as Flash memory, dynamic random-access memory (DRAM), or static random-access memory (SRAM), or any other suitable semiconductor chips. It is understood that the semiconductor chip is not limited to the final product and may include any intermediate structures during the fabrication process. Similarly, the hole structures can include any hole structures in any intermediate structure or the final product of the semiconductor chip including, but not limited to, contact holes (e.g., vertical interconnect access (VIA) holes) and channel holes. For example, the semiconductor chip may include an intermediate structure for forming a 3D NAND memory device, and the hole structure may include an array of channel hole structures, through array contact (TAC) hole structures, through silicon contact (TSC) hole structures, array common source (ASC) contact hole structures, etc., in the intermediate structure. Nevertheless, one or more geometric attributes (e.g., the tilt or overlay) of the hole structure in the semiconductor chip need to be inline measured for quality control during or after the fabrication process, according to some embodiments.

System 400 can also include one or more optical measurement instruments that can provide one or more types of signals sampled from the hole structure in the semiconductor chip, which are used as the input signals for geometry metrology of the hole structure by computing device 402. In some embodiments, the optical measurement instruments of system 400 include an optical spectrometer 404 configured to provide an optical spectrum signal 412 corresponding to the hole structure in the semiconductor chip. It is understood that the semiconductor chip may include a plurality of hole structures (e.g., an array of channel hole structures in fabricating a 3D NAND memory device), and a plurality of optical spectrum signals 412 corresponding to the plurality of hole structures may be provided by optical spectrometer 404 in other examples.

In some embodiments, optical spectrometer 404 includes a spectroscopic ellipsometer, and optical spectrum signal 412 provided by optical spectrometer 404 includes a spectroscopic ellipsometry signal. Spectroscopic ellipsometry (also known as "SE"), a surface sensitive, non-destructive, and non-contact optical metrology technique, measures the change of polarization of light when passing through a medium, which permits users to extract the material properties of the medium in this structure because the layer structure during reflection the polarized light exhibits distortion. Spectroscopic ellipsometry can employ broad band light sources, which can cover a certain spectral range in the infrared, visible, and/or ultraviolet spectral region. By that, the complex refractive index or the dielectric function tensor in the corresponding spectral region can be obtained, which gives access to a large number of physical properties, according to some embodiments. In some embodiments, the wavelength range of optical spectrum signal 412 (e.g., a spectroscopic ellipsometry signal) is between about 250 nm and about 1,300 nm, such as between 250 nm and 1,300 nm. In one example, the wavelength range of the spectroscopic ellipsometry signal is between 264 nm and 1,180 nm in measuring the x-axis component Tx of the tilt vector T (shown in FIG. 3). In another example, the wavelength range of the spectroscopic ellipsometry signal is between 256 nm and 1,270 nm in measuring the y-axis component Ty of the tilt vector T (shown in FIG. 3).

System 400 can further include an electron microscope 406 (also known as "EM") configured to provide a plurality of electron microscopy signals used as reference signals 416 by computing device 402 in training a model 408. As described below in detail, model 408 can be any suitable machine learning model that can be trained by training samples, each of which includes a pair of optical spectrum signal 412 and a labeled reference signal 416 both corresponding to the same hole structure. Electron microscope 406 is a microscope that uses a beam of accelerated electrons as a source of illumination and has a higher resolving power than light microscopes to reveal the structure of smaller objects, according to some embodiments. Electron microscope 406 can include, for example, an SEM, a transmission electron microscope (TEM), and a scanning transmission electron microscope (STEM). As described above, albeit low throughput and high maintenance cost unsuitable for continuous inline measurement, electron microscope 406, such as SEM, can provide reference signals 416 that can be labeled either manually, automatically, or semi-automatically, to indicate one or more geometric attributes (e.g., the tilt or overlay) of a hole structure with certain accuracy and precision, which are suitable as the labels in the training sampling for training model 408. In some embodiments, one or more optical features are characterized from the electron microscopy signals provided by electron microscope 406 to generate reference signals 416. That is, reference signals 416 may be raw electron microscopy signals or any other suitable signals transformed from the raw electron microscopy signals. Nevertheless, reference signals 416 can be labeled to reveal one or more geometric attributes (e.g., the tilt or overlay) of a hole structure with certain accuracy and precision. It is understood that different from conventional measurement approach in which an SEM is used for continuous inline measurement, electron microscope 406 in system 400 may be used for offline training of model 408 in which low throughput may not be a concern.

Figure 5:
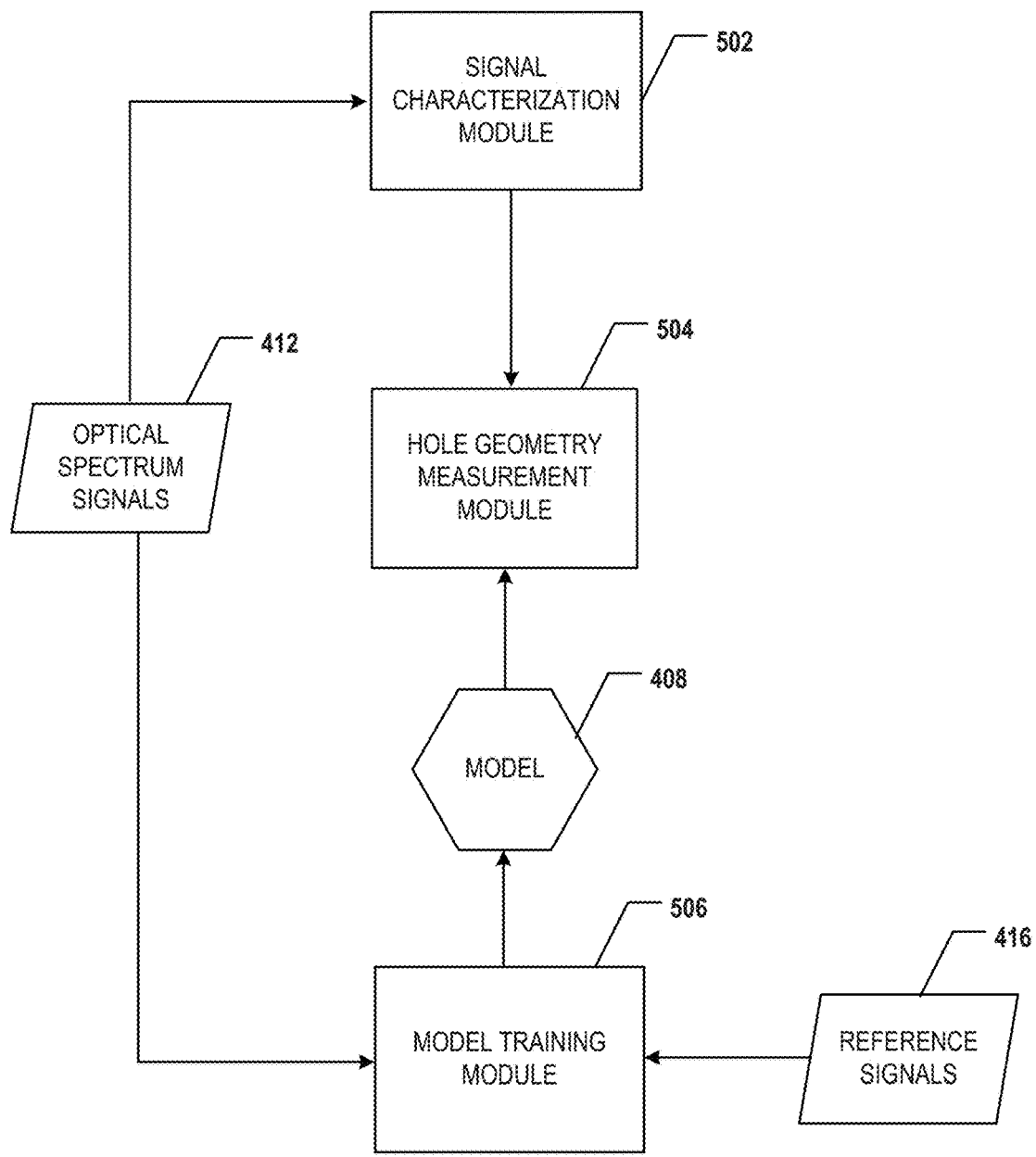
FIG. 5 illustrates a schematic diagram of an exemplary computing device of the system in FIG. 4 for measuring a geometric attribute of a hole structure in a semiconductor chip, according to some embodiments of the present disclosure.

FIG. 5 illustrates a schematic diagram of exemplary computing device 402 of system 400 in FIG. 4 for measuring a geometric attribute of a hole structure in a semiconductor chip, according to some embodiments of the present disclosure. Computing device 402 can include a plurality of functional modules and units implemented by at least one processor. In some embodiments, computing device 402 includes a signal characterization module 502, a hole geometry measurement module 504, and a model training module 506. Model 408 for measuring a geometric attribute of a hole structure in a semiconductor chip, run by computing device 402, is trained by model training module 506 and used by hole geometry measurement module 504, according to some embodiments. Model 408 can be a machine learning model trained for measuring hole geometric attributes, such as tilt or overlay. Optical spectrum signals 412 sampled by optical spectrometer 404 (shown in FIG. 4) are provided as inputs of computing device 402 for inline hole geometry measurement as well as offline model training, according to some embodiments. In some embodiments, reference signals 416 sampled by electron microscope 406 (shown in FIG. 4) are also provided as inputs of computing device 402 for offline model training.

In some embodiments, signal characterization module 502 is configured to receive optical spectrum signal 412 corresponding to the hole structure in the semiconductor chip and characterize optical spectrum signal 412 by one or more optical features. In some embodiments, optical spectrum signal 412 includes a spectroscopic ellipsometry signal having a wavelength range between 250 nm and 1,300 nm. In some embodiments, as spectroscopic ellipsometry is an indirect metrology, signal characterization, such as modeling and parameter fitting for the actual hole structure, is needed by signal characterization module 502 to extract features, such as optical features, indicative of the physical properties of the hole structure, which can be used by hole geometry measurement module 504 in hole geometry metrology using model 408. To characterize optical spectrum signal 412, signal characterization module 502 can be configured to obtain a Muller matrix based, at least in part, on the optical spectrum signal, and extract the one or more optical features from the Muller matrix. The optical features can include a reflectance or ellipsometry parameters, such as ellipsometer angles $\Psi$ and $\Delta$.

Muller matrix can provide information about the response of a medium to excitation by polarized light in either reflection or transmission configuration. For example, Muller matrix may characterize the optical properties of the sample by the interaction of polarized light with matter in the absence of non-linear effects. As represented below, Muller matrix MM is a 4×4 real matrix containing 16 elements:

$$MM = \begin{bmatrix} M_{11} & M_{12} & M_{13} & M_{14} \\ M_{21} & M_{22} & M_{23} & M_{24} \\ M_{31} & M_{32} & M_{33} & M_{34} \\ M_{41} & M_{42} & M_{43} & M_{44} \end{bmatrix}.$$

For example, in measuring the tilt of a hole structure, the Mueller matrix block off-diagonal elements $\{M_{13}, M_{23},$ $M_{14}$, $M_{24}$, $M_{31}$, $M_{32}$, $M_{41}$, $M_{42}$} may provide information about the mirror asymmetries along the spectroscopic ellipsometry plane, and the combinations of block off-diagonal elements, such as $M_{13}+M_{31}$, $M_{23}+M_{32}$, $M_{14}-M_{41}$, and $M_{24}-M_{42}$, may be interpreted as tilt signals when they are non-zero. In one example, the combinations of $M_{13}+M_{31}$, $M_{23}+M_{32}$, and $M_{14}-M_{41}$ may be used for measuring the x-axis component Tx of the tilt vector T (shown in FIG. 3), and the combinations of $M_{13}+M_{31}$, $M_{23}+M_{32}$, $M_{14}-M_{41}$, and $M_{24}-M_{42}$ may be used for measuring the y-axis component Ty of the tilt vector T (shown in FIG. 3). It is understood that any other suitable optical features may be extracted from the Muller matrix in other examples depending on, for example, the geometric attribute of the hole structure to be measured.

Figure 6:
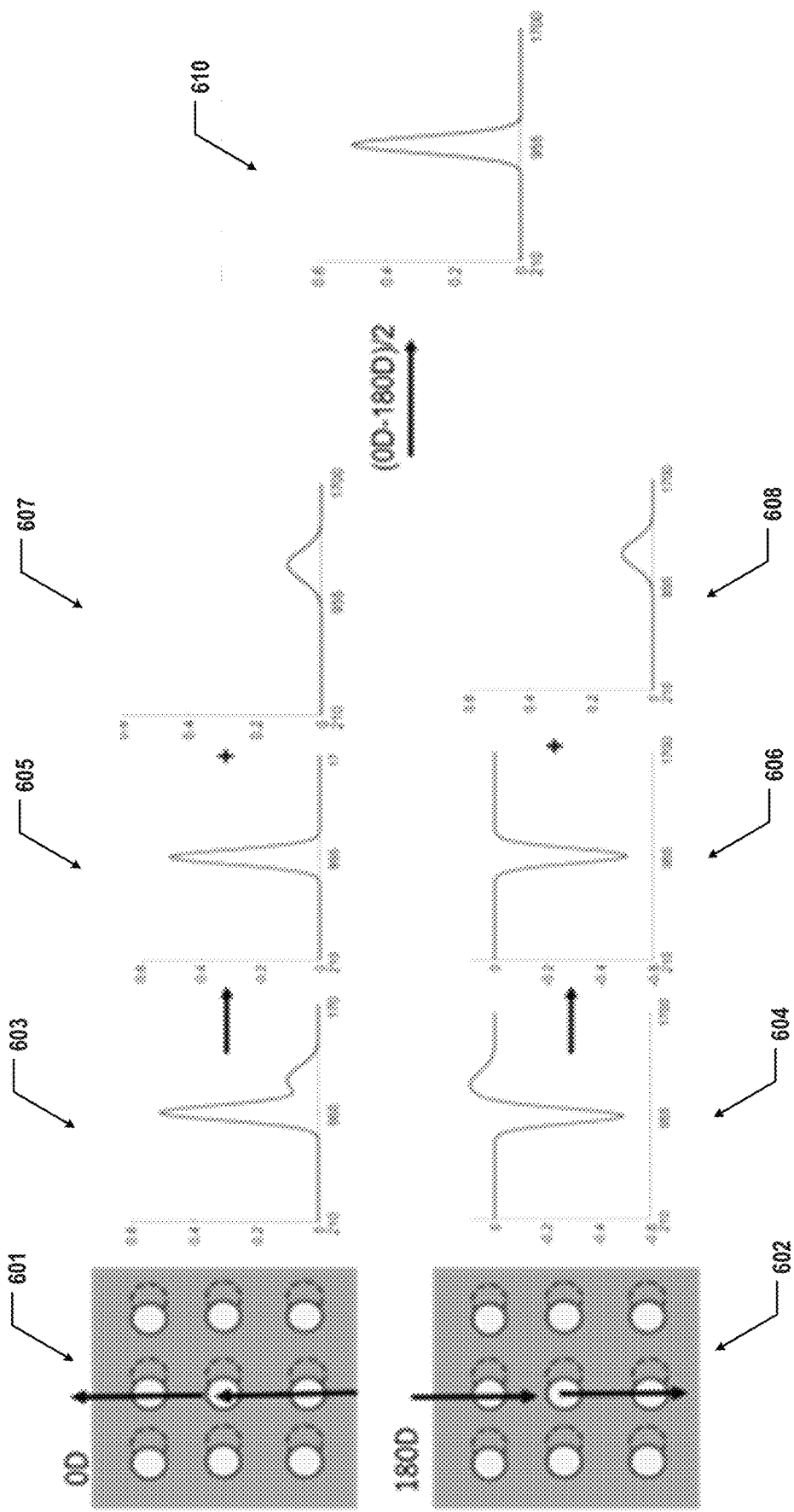
FIG. 6 illustrates an exemplary process for removing an offset in an optical spectrum signal, according to some embodiments of the present disclosure.

It is understood that an offset may be introduced into optical spectrum signal 412 due to the contribution from optical spectrometer 404 (shown in FIG. 4), which may affect the subsequent processes. In some embodiments, signal characterization module 502 is configured to remove the offset in optical spectrum signal 412 based, at least in part, on two optical spectrum signals in the opposite directions. That is, two optical spectrum signals in opposite directions corresponding to the same hole structure can be obtained by optical spectrometer 404, and the offset can be removed based on the two optical spectrum signals in the opposite directions. For example, FIG. 6 illustrates an exemplary process for removing an offset in an optical spectrum signal, according to some embodiments of the present disclosure. A first optical spectrum signal may be obtained from a hole structure in the 0D direction in 601, and a second optical spectrum signal may be obtained from the same hole structure in the 180D direction opposite to the 0D direction in 602. An optical feature extracted from the corresponding Muller matrix of the first optical spectrum signal, such as the combination of $M_{13}+M_{31}$ in 603, may be split into two parts: the sample tilt in 605 and the contribution from optical spectrometer 404 in 607. Similarly, an optical feature extracted from the corresponding Muller matrix of the second optical spectrum signal, such as the combination of $M_{13}+M_{31}$ in 604, may be split into two parts: the sample tilt in 606 and the contribution from optical spectrometer 404 in 608. Assuming the contributions from optical spectrometer 404 are the same in 607 and 608, the two optical features in 603 and 604 may be averaged to cancel out the contribution from optical spectrometer 404 in 610. As a result, the offset introduced by optical spectrometer 404 can be removed.

Referring back to FIG. 5, hole geometry measurement module 504 is configured to determine the geometric attribute of the hole structure based, at least in part, on the optical features using model 408, according to some embodiments. Model 408 can be trained by model training module 506 from a plurality of training samples each including a pair of optical spectrum signal 412 and labeled reference signal 416 both corresponding to the same hole structure as described below in detail. Labeled reference signal 416 can include an electron microscopy signal indicative of the geometric attribute. Model 408 can be any suitable machine learning model, such as an artificial neural network (ANN). It is understood that other machine learning models, such as support vector machine (SVM), decision tree, regression analysis, Bayesian network, etc., may be used as model 408 in other examples.

In some embodiments, any suitable feature selection and feature extraction approaches can be applied by hole geometry measurement module 504 to select and/or extract features (e.g., feature vectors), either latent features or patent features, to reduce the complexity and improve the efficiency of the determination process. In some embodiments, feature selection and feature extraction are further applied to the optical features characterized by signal characterization module 502 from optical spectrum signal 412. In some embodiments, the optical features characterized by signal characterization module 502 from optical spectrum signal 412 are inputted into hole geometry measurement module 504 directly without any further feature selection or feature extraction. That is, feature selection and feature extraction can be performed by signal characterization module 502 as described above in obtaining the optical features. In some embodiments, feature selection and feature extraction (other than the signal characterization function performed by signal characterization module 502) are applied directly to optical spectrum signal 412.

The output of hole geometry measurement module 504 can be any suitable geometric attribute of the hole structure in the semiconductor chip. Model 408 can be trained for measuring the specific geometric attribute. In some embodiments, the geometric attribute includes the tilt of the hole structure, such as the tilt vector T, the x-axis component Tx of the tilt vector T, and the y-axis component Ty of the tilt vector T (e.g., shown in FIGS. 1B, 2A, 2B, and 3). In some embodiments, the hole structure includes a lower hole and an upper hole (e.g., the channel hole structure including lower and upper channel holes 106-1 and 106-2 in FIG. 1C), and the geometric attribute includes an overlay between the upper hole and the lower hole (e.g., lower and upper channel holes 106-1 and 106-2 shown in FIG. 1C). It is understood that depending on the specific geometric attribute of the hole structure to be measured, beside model 408, the optical feature characterization function or any other feature selection and feature extraction functions performed by signal characterization module 502 and/or hole geometry measurement module 504 may be changed accordingly as well.

Figure 7:
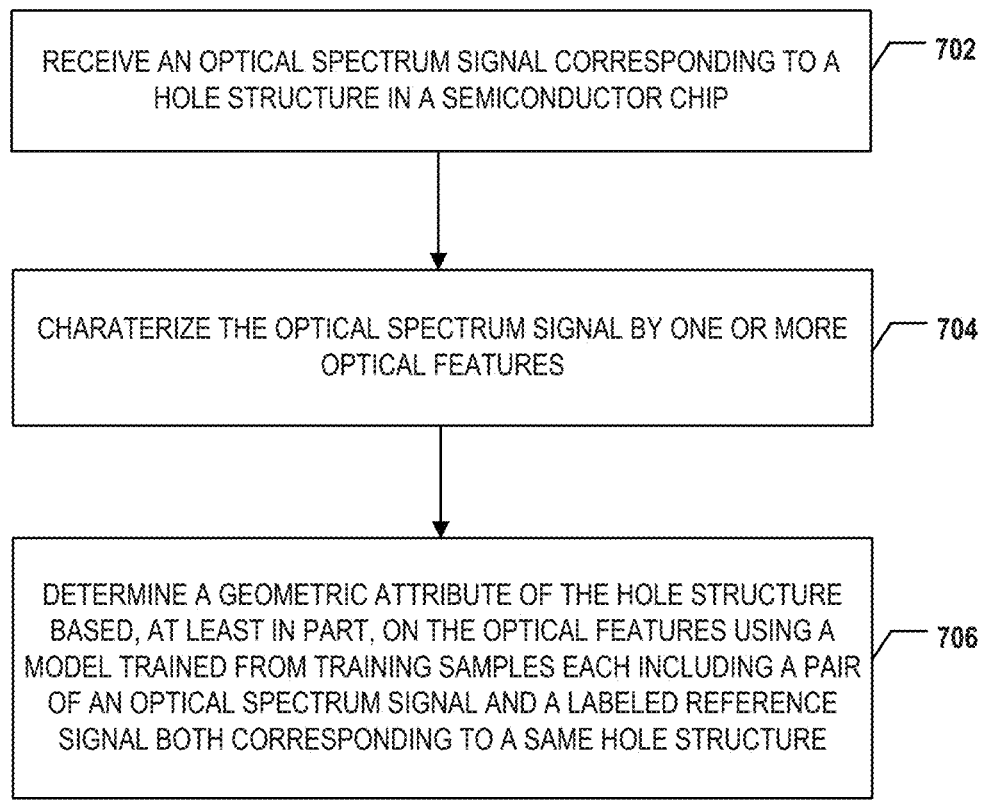
FIG. 7 is a flowchart of an exemplary method for measuring a geometric attribute of a hole structure in a semiconductor chip, according to some embodiments of the present disclosure.

FIG. 7 is a flowchart of an exemplary method 700 for measuring a geometric attribute of a hole structure in a semiconductor chip, according to some embodiments of the present disclosure. Examples of the device that can perform operations of method 700 include computing device 402 depicted in FIGS. 4 and 5. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which an optical spectrum signal corresponding to the hole structure in the semiconductor chip is received. For example, optical spectrum signal 412 may be received by signal characterization module 502 of computing device 402. In some embodiments, the wavelength range of the optical spectrum signal is between 250 nm and 1,300 nm.

Figure 8:
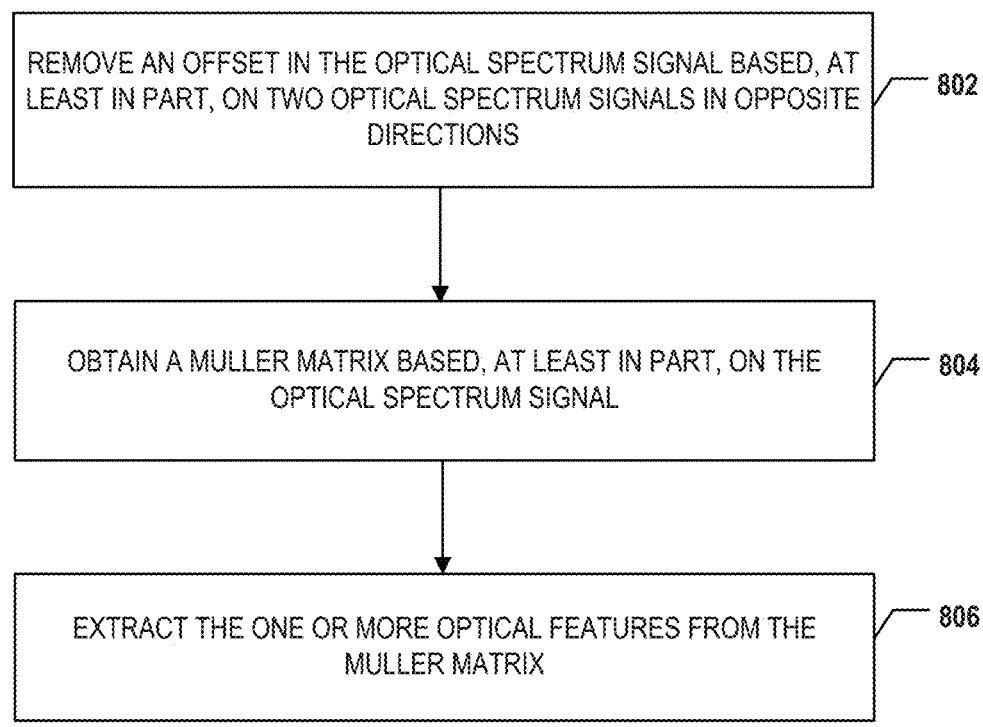
FIG. 8 is a flowchart of an exemplary method for characterizing an optical spectrum signal, according to some embodiments of the present disclosure.

Method 700 proceeds to operation 704, as illustrated in FIG. 7, in which the optical spectrum signal is characterized by one or more optical features. For example, optical spectrum signal 412 may be characterized by optical features using signal characterization module 502. FIG. 8 is a flowchart of an exemplary method 800 for characterizing an optical spectrum signal, according to some embodiments of the present disclosure. It is understood that the operations shown in method 800 are not exhaustive and that other operations can be performed as well before, after, or between any of the illustrated operations. Further, some of the operations may be performed simultaneously, or in a different order than shown in FIG. 8. Method 800 starts at operation 802, in which the optical spectrum signal includes two optical spectrum signals in opposite directions, and an offset in the optical spectrum signal is removed based, at least in part, on the two optical spectrum signals in the opposite directions. Method 800 proceeds to operation 804, in which a Muller matrix is obtained based, at least in part, on the optical spectrum signal. Method 800 proceeds to operation 806, in which the one or more optical features are extracted from the Muller matrix. The optical features can include at least one of a reflectance or ellipsometry parameters.

Referring back to FIG. 7, method 700 proceeds to operation 706, as illustrated in FIG. 7, in which the geometric attribute of the hole structure is determined based, at least in part, on the optical features using a model. The model can be trained from a plurality of training samples each including a pair of an optical spectrum signal and a labeled reference signal both corresponding to the same hole structure. The labeled reference signal can include an electron microscopy signal indicative of the geometric attribute. For example, the geometric attribute of the hole structure may be determined based on the optical features by hole geometry measurement module 504 of computing device 402 using model 408. In some embodiments, the model includes an ANN. In some embodiments, the geometric attribute includes the tilt of the hole structure. In some embodiments, the hole structure includes a lower hole and an upper hole, and the geometric attribute includes an overlay between the upper hole and the lower hole.

Figure 9:
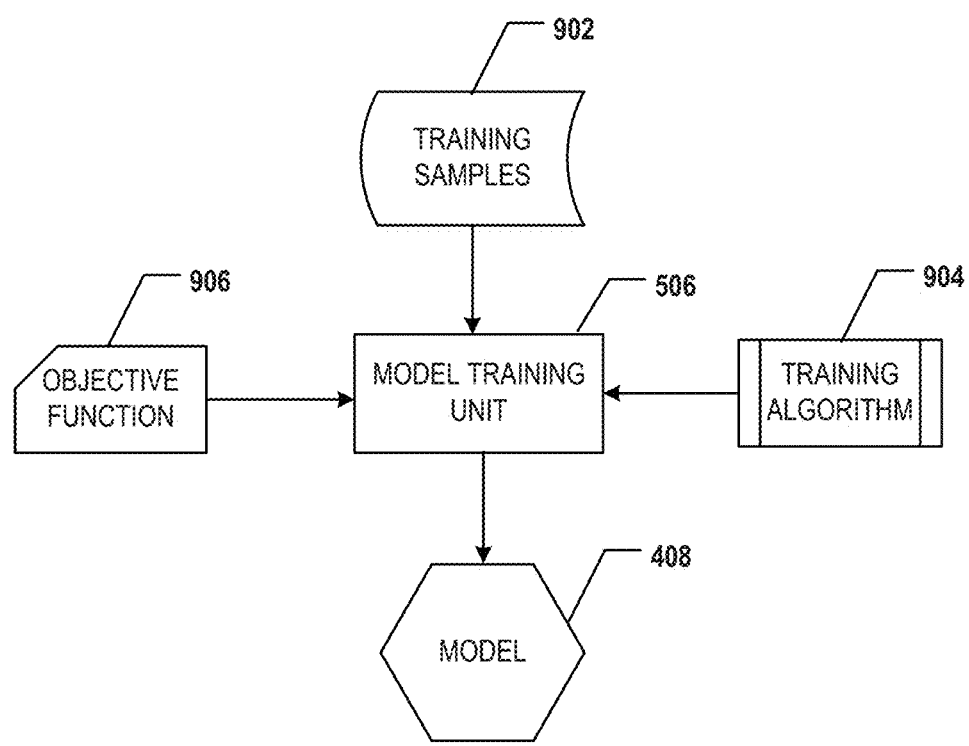
FIG. 9 illustrates a schematic diagram of an exemplary system for training a model for measuring a geometric attribute of a hole structure in a semiconductor chip, according to some embodiments of the present disclosure.

FIG. 9 illustrates a schematic diagram of an exemplary system 900 for training model 408 for measuring a geometric attribute of a hole structure in a semiconductor chip, according to some embodiments of the present disclosure. Model 408 may be any machine learning model disclosed herein. System 900 can include a plurality of functional modules and units implemented by at least one processor. In some embodiments, system 900 includes model training module 506 configured to train model 408 over a set of training samples 902 based on an objective function 906 (also known as a "loss function") using a training algorithm 904. Model 408 can include an ANN or any other suitable machine learning models.

To train model 408, model training module 506 can obtain training samples 902 each including a pair of an optical spectrum signal and a reference signal corresponding to the same hole structure. In one example, the size of training samples 902 may be greater than 2,000. The reference signal can be labeled with a labeled geometric attribute of the hole structure. For example, each reference signal may be manually, automatically, or semi-automatically labeled with the value of the specific geometric attribute of the hole structure, such as the tilt of the hole structure or the overlay between the upper and lower holes in the hole structure. In some embodiments, the optical spectrum signal includes a spectroscopic ellipsometry signal, and the reference signal includes an electron microscopy signal.

To train model 408, model training module 506 can also estimate an estimated geometric attribute of the hole structure using model 408. In some embodiments, an estimated geometric attribute of the hole structure is estimated using model 408 based on the optical spectrum signal in training sample 902 as an input. To train model 408, model training module 506 can further adjust one or more parameters of model 408 based, at least in part, on a difference between the labeled geometric attribute and the estimated geometric attribute in each training sample 902. In some embodiments, model 408 includes one or more parameters (e.g., the parameters in ANN) that can be jointly adjusted by model training module 506 when being fed with training samples 902. Model training module 506 can jointly adjust the parameters of model 408 to minimize objective function 906 over training samples 902 using training algorithm 904. Any suitable objective function 906 and training algorithm 904 can be selected based on the specific type of model 408 to be trained. For example, a mean square error (MSE)-based objective function may be used by model training module 506 in combination with a supervised training algorithm, a reinforcement learning algorithm, or a self-learning algorithm. It is understood that the training of model 408, e.g., the adjustment of the parameter, may be performed in an iterative manner.

Figure 10:
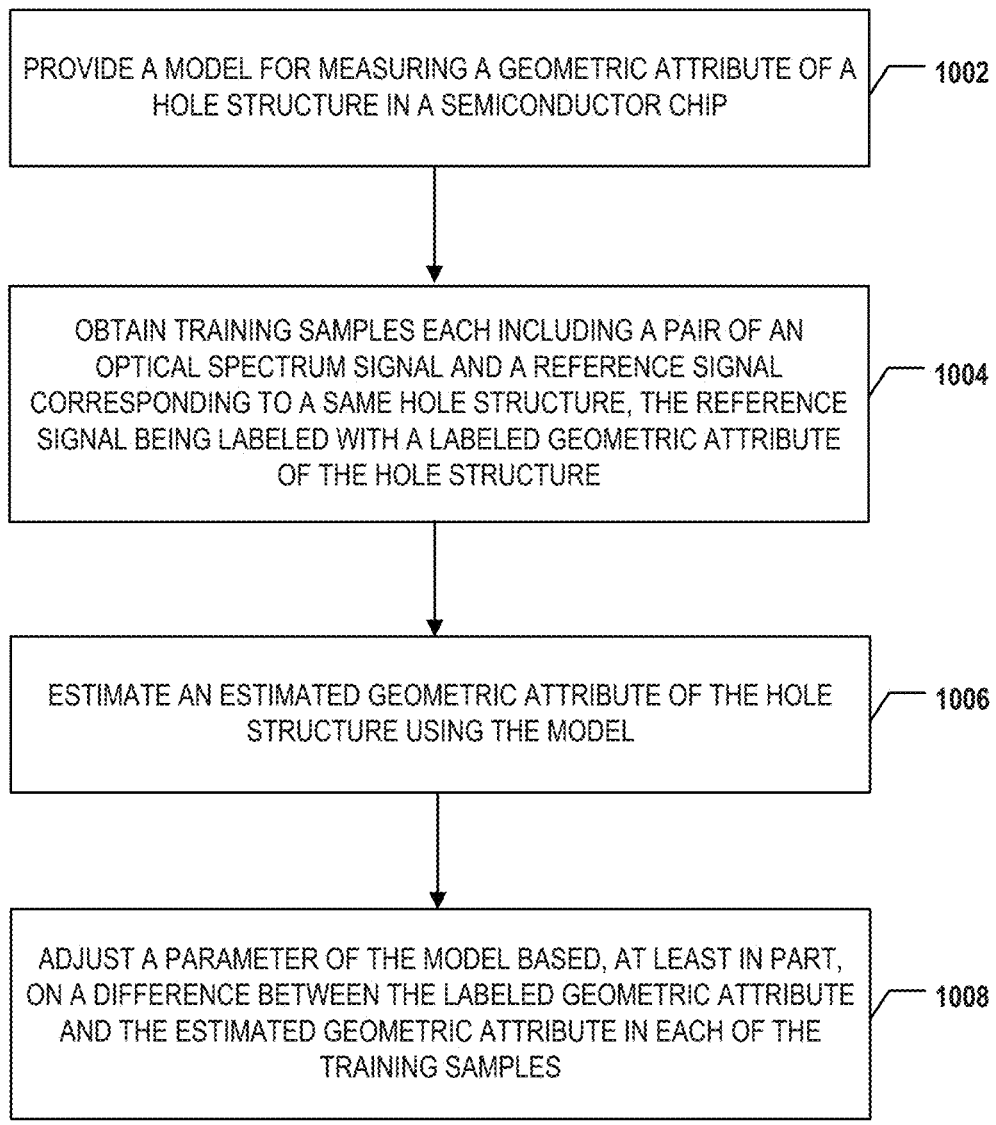
FIG. 10 is a flowchart of an exemplary method for training a model for measuring a geometric attribute of a hole structure in a semiconductor chip, according to some embodiments of the present disclosure.

FIG. 10 a flowchart of an exemplary method 1000 for training a model for measuring a geometric attribute of a hole structure in a semiconductor chip, according to some embodiments of the present disclosure. Examples of the system that can perform operations of method 1000 include system 900 depicted in FIG. 9. It is understood that the operations shown in method 1000 are not exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which a model for measuring a geometric attribute of a hole structure in a semiconductor chip is provided. The model can include an ANN. For example, model 408 may be provided to model training module 506. Method 1000 proceeds to operation 1004, as illustrated in FIG. 10 in which a plurality of training samples each including a pair of an optical spectrum signal and a reference signal corresponding to the same hole structure are obtained. The reference signal is labeled with a labeled geometric attribute of the hole structure, according to some embodiments. The optical spectrum signal can include a spectroscopic ellipsometry signal, and the reference signal can include an electron microscopy signal. For example, training samples 902 may be obtained by model training module 506. Method 1000 proceeds to operation 1006, as illustrated in FIG. 10 in which an estimated geometric attribute of the hole structure using the model is estimated. In some embodiments, the geometric attribute includes the tilt of the hole structure. In some embodiments, the hole structure includes a lower hole and an upper hole, and the geometric attribute includes an overlay between the upper hole and the lower hole. Method 1000 proceeds to operation 1008, as illustrated in FIG. 10 in which a parameter of the model is adjusted based, at least in part, on a difference between the labeled geometric attribute and the estimated geometric attribute in each of the training samples. For example, one or more parameters of model 408 may be adjusted by model training module 506 over training samples 902.

Figure 11:
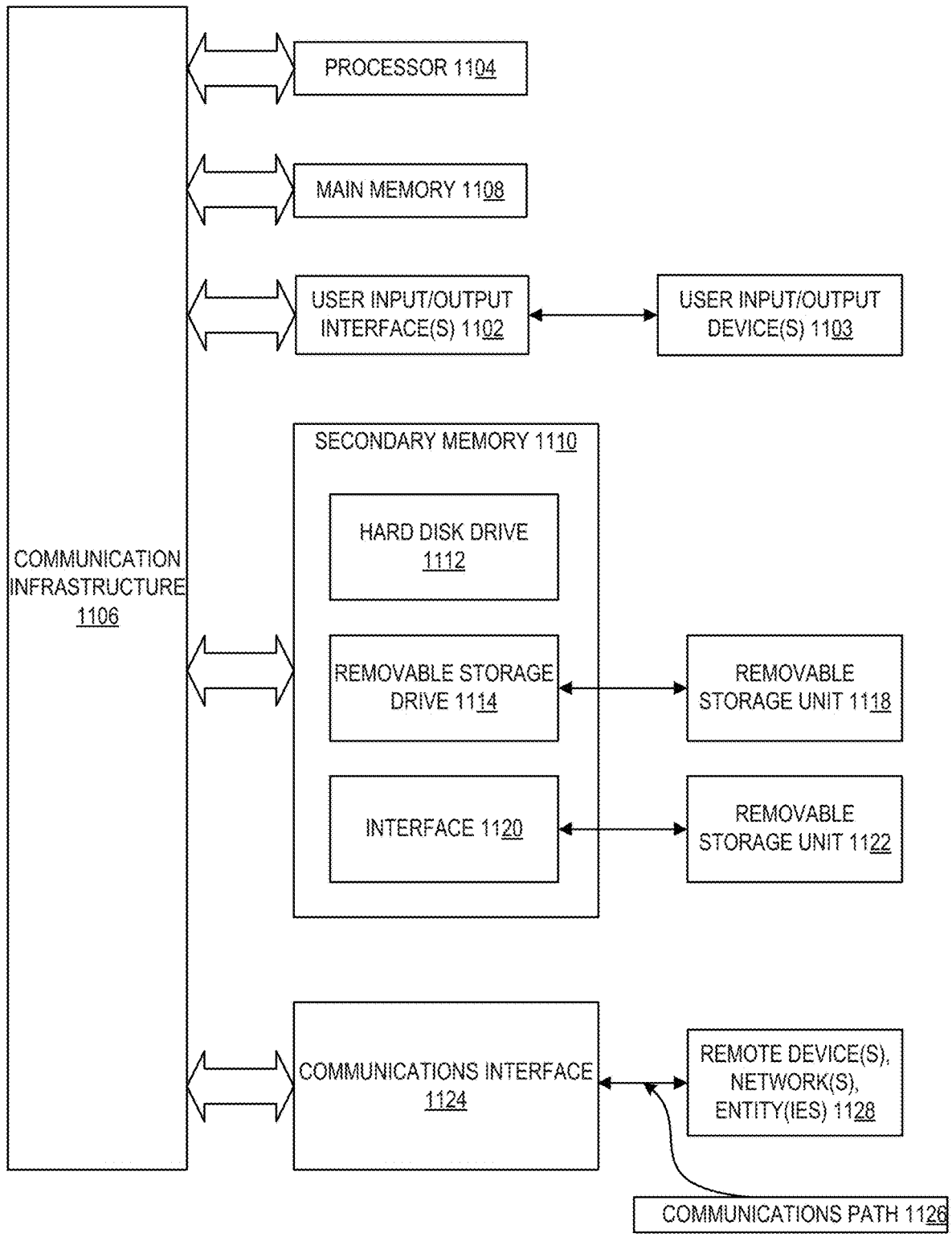
FIG. 11 illustrates a block diagram of an exemplary computing device, according to some embodiments of the present disclosure.

Various embodiments can be implemented, for example, using one or more computing devices, such as a computing device 1100 shown in FIG. 11. One or more computing devices 1100 can be an example of computing device 402 in FIG. 4 and can be used, for example, to implement method 700 of FIG. 7, method 800 of FIG. 8, and method 1000 of FIG. 10. For example, computing device 1100 can perform various functions in hole geometry metrology, such as signal characterization, hole geometric attribute determination, and model training. Computing device 1100 can be any computer capable of performing the functions described herein.

Computing device 1100 can include one or more processors (also called central processing units, or CPUs), such as a processor 1104. Processor 1104 is connected to a communication infrastructure or bus 1106, according to some embodiments. One or more processors 1104 can each be a GPU. In some embodiments, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computing device 1100 can also include user input/output device(s) 1103, such as monitors, keyboards, pointing devices, etc., which communicate with communication infrastructure or bus 1106 through user input/output interface(s) 1102.

Computing device 1100 can also include a main or primary memory 1108, such as random-access memory (RAM). Main memory 1108 can include one or more levels of cache. Main memory 1108 has stored therein control logic (i.e., computer software) and/or data, according to some embodiments.

Computing device 1100 can also include one or more secondary storage devices or memory 1110. Secondary memory 1110 can include, for example, a hard disk drive 1112 and/or a removable storage device or drive 1114. Removable storage drive 1114 can be a floppy disk drive, a magnetic tape drive, a compact disk drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data, according to some embodiments. Removable storage unit 1118 can be a floppy disk, magnetic tape, compact disk, DVD, optical storage disk, and/any other computer data storage device. Removable storage drive 1114 can read from and/or writes to removable storage unit 1118 in a well-known manner.

According to some embodiments, secondary memory 1110 can include other means, instrumentalities or other approaches for allowing computer programs and/or other instructions and/or data to be accessed by computing device 1100. Such means, instrumentalities or other approaches may include, for example, a removable storage unit 1122 and an interface 1120. Examples of removable storage unit 1122 and interface 1120 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computing device 1100 can further include a communication or network interface 1124. Communication interface 1124 enables computing device 1100 to communicate and interact with any combination of remote devices, remote networks, remote entities, etc. (individually and collectively referenced by reference number 1128), according to some embodiments. For example, communication interface 1124 may allow computing device 1100 to communicate with remote devices 1128 over communications path 1126, which may be wired and/or wireless, and which may include any combination of LANs, WANs, the Internet, etc. Control logic and/or data may be transmitted to and from computing device 1100 via communication path 1126.

In some embodiments, a tangible apparatus or article of manufacture comprising a tangible computer useable or readable medium having control logic (software) stored thereon is also referred to herein as a computer program product or program storage device. This includes, but is not limited to, computing device 1100, main memory 1108, secondary memory 1110, and removable storage units 1118 and 1122, as well as tangible articles of manufacture embodying any combination of the foregoing. Such control logic, when executed by one or more data processing devices (such as computing device 1100), causes such data processing devices to operate as described herein.

Based on the teachings contained in this disclosure, it will be apparent to persons skilled in the relevant art(s) how to make and use embodiments of the present disclosure using data processing devices, computer systems and/or computer architectures other than that shown in FIG. 11. In particular, embodiments may operate with software, hardware, and/or operating system implementations other than those described herein.

According to one aspect of the present disclosure, a method for measuring a geometric attribute of a hole structure in a semiconductor chip is disclosed. An optical spectrum signal corresponding to the hole structure in the semiconductor chip is received. The optical spectrum signal is characterized by one or more optical features. The geometric attribute of the hole structure is determined based, at least in part, on the optical features using a model. The model is trained from a plurality of training samples each including a pair of an optical spectrum signal and a labeled reference signal both corresponding to a same hole structure.

In some embodiments, the optical spectrum signal includes a spectroscopic ellipsometry signal.

In some embodiments, a wavelength range of the optical spectrum signal is between about 250 nm and about 1,300 nm.

In some embodiments, the geometric attribute includes a tilt of the hole structure.

In some embodiments, the hole structure includes a lower hole and an upper hole, and the geometric attribute includes an overlay between the upper hole and the lower hole.

In some embodiments, to characterize the optical spectrum signal, a Muller matrix is obtained based, at least in part, on the optical spectrum signal, and the one or more optical features are extracted from the Muller matrix.

In some embodiments, the one or more optical features include at least one of a reflectance or ellipsometry parameters.

In some embodiments, the optical spectrum signal includes two optical spectrum signals in opposite directions, and to characterize the optical spectrum signal, an offset in the optical spectrum signal is removed based, at least in part, on the two optical spectrum signals in opposite directions.

In some embodiments, the model includes an ANN.

In some embodiments, the labeled reference signal includes an electron microscopy signal indicative of the geometric attribute.

According to another aspect of the present disclosure, a system for measuring a geometric attribute of a hole structure in a semiconductor chip includes an optical spectrometer and at least one processor. The optical spectrometer is configured to provide an optical spectrum signal corresponding to the hole structure in the semiconductor chip. The at least one processor is configured to characterize the optical spectrum signal by one or more optical features. The at least one processor is also configured to determine the geometric attribute of the hole structure based, at least in part, on the optical features using a model. The model is trained from a plurality of training samples each including a pair of an optical spectrum signal and a labeled reference signal both corresponding to a same hole structure.

In some embodiments, the optical spectrometer includes a spectroscopic ellipsometer, and the optical spectrum signal includes a spectroscopic ellipsometry signal.

In some embodiments, a wavelength range of the optical spectrum signal is between about 250 nm and about 1,300 nm.

In some embodiments, the geometric attribute includes a tilt of the hole structure.

In some embodiments, the hole structure includes a lower hole and an upper hole, and the geometric attribute includes an overlay between the upper hole and the lower hole.

In some embodiments, to characterize the optical spectrum signal, the at least one processor is configured to obtain a Muller matrix based, at least in part, on the optical spectrum signal, and extract the one or more optical features from the Muller matrix.

In some embodiments, the one or more optical features include at least one of a reflectance or ellipsometry parameters.

In some embodiments, the optical spectrum signal includes two optical spectrum signals in opposite directions, and to characterize the optical spectrum signal, the at least one processor is configured to remove an offset in the optical spectrum signal based, at least in part, on the two optical spectrum signals in opposite directions.

In some embodiments, the model includes an ANN.

In some embodiments, the labeled reference signal includes an electron microscopy signal indicative of the geometric attribute, and the system further includes an electron microscope configured to provide a plurality of electron microscopy signals.

According to still another aspect of the present disclosure, a tangible computer-readable device has instructions stored thereon that, when executed by at least one computing device, causes the at least one computing device to perform operations. The operations include receiving an optical spectrum signal corresponding to a hole structure in a semiconductor chip. The operations also include characterizing the optical spectrum signal by one or more optical features. The operations further include determining the geometric attribute of the hole structure based, at least in part, on the optical features using a model. The model is trained from a plurality of training samples each including a pair of an optical spectrum signal and a labeled reference signal both corresponding to a same hole structure.

According to yet another aspect of the present disclosure, a method for training a model is disclosed. A model for measuring a geometric attribute of a hole structure in a semiconductor chip is provided by at least one processor. A plurality of training samples each including a pair of an optical spectrum signal and a reference signal corresponding to a same hole structure are obtained by the at least one processor. The reference signal is labeled with a labeled geometric attribute of the hole structure. An estimated geometric attribute of the hole structure is estimated using the model. A parameter of the model is adjusted based, at least in part, on a difference between the labeled geometric attribute and the estimated geometric attribute in each of the training samples by the at least one processor.

In some embodiments, the optical spectrum signal includes a spectroscopic ellipsometry signal.

In some embodiments, the geometric attribute includes a tilt of the hole structure.

In some embodiments, the hole structure includes a lower hole and an upper hole, and the geometric attribute includes an overlay between the upper hole and the lower hole.

In some embodiments, the reference signal comprises an electron microscopy signal.

In some embodiments, the model includes an ANN.

According to yet another aspect of the present disclosure, a system for training a model includes a memory and at least one processor operatively coupled to the memory. The at least one processor is configured to provide a model for measuring a geometric attribute of a hole structure in a semiconductor chip. The at least one processor is also configured to obtain a plurality of training samples each including a pair of an optical spectrum signal and a reference signal corresponding to a same hole structure. The reference signal is labeled with a labeled geometric attribute of the hole structure. The at least one processor is further configured to estimate an estimated geometric attribute of the hole structure using the model. The at least one processor is further configured to adjust a parameter of the model based, at least in part, on a difference between the labeled geometric attribute and the estimated geometric attribute in each of the training samples.

In some embodiments, the optical spectrum signal includes a spectroscopic ellipsometry signal.

In some embodiments, the geometric attribute includes a tilt of the hole structure.

In some embodiments, the hole structure includes a lower hole and an upper hole, and the geometric attribute includes an overlay between the upper hole and the lower hole.

In some embodiments, the reference signal comprises an electron microscopy signal.

In some embodiments, the model includes an ANN.

According to yet another aspect of the present disclosure, a tangible computer-readable device has instructions stored thereon that, when executed by at least one computing device, causes the at least one computing device to perform operations. The operations include providing a model for measuring a geometric attribute of a hole structure in a semiconductor chip. The operations also include obtaining a plurality of training samples each including a pair of an optical spectrum signal and a reference signal corresponding to a same hole structure. The reference signal is labeled with a labeled geometric attribute of the hole structure. The operations further include estimating an estimated geometric attribute of the hole structure using the model. The operations further include adjusting a parameter of the model based, at least in part, on a difference between the labeled geometric attribute and the estimated geometric attribute in each of the training samples.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for training a model for measuring a geometric attribute of a hole structure, comprising:
   capturing, by an optical spectrometer, optical spectrum signals and by an electron microscope, reference signals each corresponding to one of the optical spectrum signals to obtain a model for measuring a geometric attribute of a hole structure in a semiconductor chip, the model comprising a plurality of training samples each comprising a pair of one of the optical spectrum signals and a corresponding reference signal, wherein each of the reference signals is labeled with a labeled geometric attribute of the hole structure;
   inputting one of the optical spectrum signals into at least one processor to estimate, by the at least one processor, an estimated geometric attribute of the hole structure using the model; and
   adjusting, by the at least one processor, a parameter of the model based, at least in part, on a difference between the labeled geometric attribute and the estimated geometric attribute in each of the training samples.

2. The method of claim 1, wherein each of the optical spectrum signals comprises a spectroscopic ellipsometry signal.

3. The method of claim 1, wherein the geometric attribute comprises a tilt of the hole structure.

4. The method of claim 1, wherein the hole structure comprises a lower hole and an upper hole, and the geometric attribute comprises an overlay between the upper hole and the lower hole.

5. The method of claim 1, wherein each of the reference signals comprises an electron microscopy signal.

6. The method of claim 1, wherein the model comprises an artificial neural network (ANN).

7. The method of claim 1, wherein a wavelength range of each of the optical spectrum signals is between about 250 nm and about 1,300 nm.

8. The method of claim 1, wherein:
   the geometric attribute comprises a tilt vector comprising an x-axis component and a y-axis component.

9. The method of claim 8, wherein:
   each of the optical spectrum signals comprises a spectroscopic ellipsometry signal; and
   a wavelength range of the spectroscopic ellipsometry signal in measuring the x-axis component is between about 264 nm and 1,180 nm.

10. The method of claim 9, wherein:
    a wavelength range of the spectroscopic ellipsometry signal in measuring the y-axis component is between about 256 nm and 1,270 nm.

11. A system for training a model for measuring a geometric attribute of a hole structure, comprising:
    a memory; and
    at least one processor operatively coupled to the memory and configured to:
       provide a model for measuring a geometric attribute of a hole structure in a semiconductor chip;
       obtain a plurality of training samples each comprising a pair of one of optical spectrum signals and one of reference signals corresponding to a same hole structure,
       wherein:
          the optical spectrum signals are captured by an optical spectrometer, and the reference signals, each corresponding to one of the optical spectrum signals, are captured by an electron microscope; and
          each of the reference signals is labeled with a labeled geometric attribute of the hole structure;
       input one of the optical spectrum signals to estimate an estimated geometric attribute of the hole structure using the model; and
       adjust a parameter of the model based, at least in part, on a difference between the labeled geometric attribute and the estimated geometric attribute in each of the training samples.

12. The system of claim 11, wherein each of the optical spectrum signals comprises a spectroscopic ellipsometry signal.

13. The system of claim 11, wherein the geometric attribute comprises a tilt of the hole structure.

14. The system of claim 11, wherein the hole structure comprises a lower hole and an upper hole, and the geometric attribute comprises an overlay between the upper hole and the lower hole.

15. The system of claim 11, wherein each of the reference signals comprises an electron microscopy signal.

16. The system of claim 11, wherein the model comprises an artificial neural network (ANN).

17. The system of claim 11, wherein a wavelength range of each of the optical spectrum signals is between about 250 nm and about 1,300 nm.

18. The system of claim 11, further comprising:
    the optical spectrometer configured to capture the optical spectrum signals.

19. The system of claim 11, further comprising:
    The electron microscope configured to capture the reference signals.

20. A tangible computer-readable device having instructions stored thereon that, when executed by at least one computing device, cause the at least one computing device to perform operations comprising:
    providing a model for measuring a geometric attribute of a hole structure in a semiconductor chip;
    obtaining a plurality of training samples each comprising a pair of one of optical spectrum signals and one of reference signals corresponding to a same hole structure, wherein:
       the optical spectrum signals are captured by an optical spectrometer, and the reference signals, each corresponding to one of the optical spectrum signals, are captured by an electron microscope; and
       each of the reference signals is labeled with a labeled geometric attribute of the hole structure;
    input one of the optical spectrum signals to estimate an estimated geometric attribute of the hole structure using the model; and adjust a parameter of the model based, at least in part, on a difference between the labeled geometric attribute and the estimated geometric attribute in each of the training samples.

* * * * *